United States Patent
Koch et al.

[11] Patent Number: 5,963,072
[45] Date of Patent: Oct. 5, 1999

[54] DISCRETE PROGRAMMABLE ONE-SHOT TIMED PULSE CIRCUIT

[75] Inventors: Stuart A. Koch, Whitmore Lake; David F. Haggitt, Lake Orion, both of Mich.

[73] Assignee: Automotive Systems Laboratory, Inc., Farmington Hills, Mich.

[21] Appl. No.: 08/989,802

[22] Filed: Dec. 12, 1997

[51] Int. Cl.⁶ ...................................................... H03K 5/13
[52] U.S. Cl. ............................................. 327/227; 327/433
[58] Field of Search .................................... 327/227, 427, 327/430, 431, 433, 434, 435, 478, 171, 172, 173, 174, 175; 331/113 R

[56] References Cited

U.S. PATENT DOCUMENTS

| | | | |
|---|---|---|---|
| 5,808,504 | 9/1998 | Chikai et al. | 327/424 |
| 5,841,827 | 11/1998 | Chevallier | 327/175 |

*Primary Examiner*—Tuan T. Lam
*Attorney, Agent, or Firm*—Lyon, P.C.

[57] ABSTRACT

The disclosure relates to an electrical circuit used in automotive passenger restraint systems. The circuit utilizes reliable and inexpensive electrical components to provide one-shot actuation of a load. In addition, the circuit allows for very low quiescent current draw, making it ideal for automotive applications.

1 Claim, 1 Drawing Sheet

DISCRETE PROGRAMMABLE ONE-SHOT TIMED PULSE CIRCUIT

The invention relates to an electrical circuit used in automotive passenger restraint systems. More specifically, the invention relates to a circuit that will provide for the single activation of a load when switched, while requiring extremely low standby current.

BACKGROUND OF THE INVENTION

In automotive passenger restraint systems (seatbelt systems) it is often necessary to energize a load such as a solenoid or coil for a brief time. For example, seatbelt comfort release systems employ a switching means in the seatbelt buckle to activate a one-shot circuit. This circuit produces an electrical pulse that is used to briefly energize a solenoid coil in a seatbelt retractor assembly, thereby releasing and retracting the seatbelt.

Previously, providing single switched activation of a load has required reliance upon circuits that utilize components such as SCRs and relays. SCRs are edge-triggered devices that switch current to their outputs when small changes in voltage are detected at their inputs. Relays are electromechanical devices typically utilizing a coil to activate mechanical switch contacts.

Known one-shot activation circuits suffer from several defects. First, known switching circuits consume at least moderate amounts of battery current (quiescent draw) even when not in use. This characteristic is particularly disadvantageous for automotive applications where battery current drain must be minimized. In addition, known circuits utilizing SCRs are typically unreliable. SCRs are notoriously sensitive to electrical noise and often activate unnecessarily. Finally, circuits using electromechanical relays require more space and improved shielding because relays are relatively large and electrically noisy devices.

SUMMARY OF THE INVENTION

The circuit of the present invention solves the aforesaid problems by utilizing conventional TTL (transistor to transistor logic) devices in combination with common electrical components such as resistors and capacitors. Since these circuit components are inexpensive, readily available, and relatively reliable, this invention provides a one-shot activation circuit that is economical and durable. In addition, since SCRs are eliminated, the current consumption of the present circuit is low when the circuit is not switching a load (standing by) and the circuit is not susceptible to electrical noise. The elimination of electromechanical relays also allows the circuit to be very compact.

DETAILED DESCRIPTION OF THE PREFERRED EMBODIMENT(S)

Figure 1:
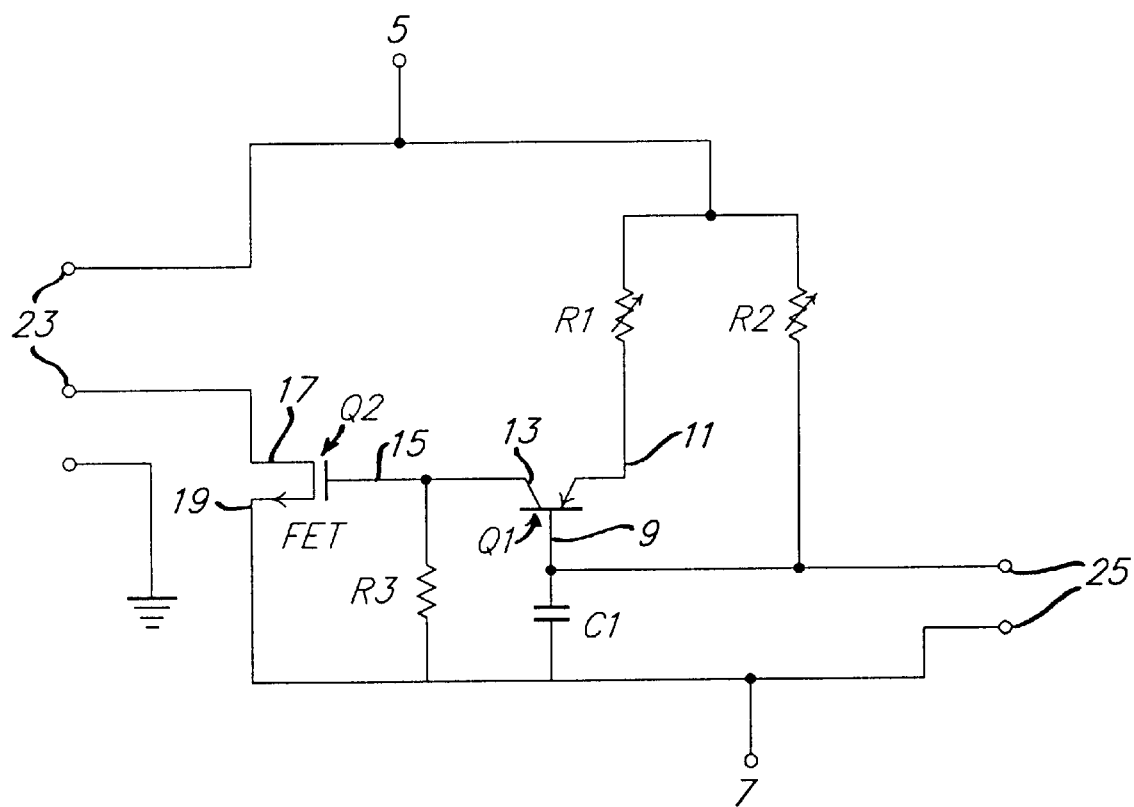
FIG. 1 is a schematic of a circuit in accordance with the invention.

A discrete programmable one-shot timed pulse circuit (FIG. 1) in accordance with the preferred constructed embodiment of the present invention comprises a spaced pair of positive 5 and negative 7 terminals for connecting a source of direct current potential to the circuit. Base electrode 9 of transistor Q1 having collector 13, emitter 11 and base 9 electrodes is connected to selectively variable capacitor C1. Capacitor C1 is also connected to negative terminal 7.

Collector electrode 13 is connected to gate electrode 15 of TTL device Q2, having gate 15, drain 17, and source 19 electrodes. Source electrode 19 is connected to negative terminal 7. Selectively variable first resistor R1 is connected to positive terminal 5 and emitter electrode 11. Selectively variable second resistor R2 is connected to positive terminal 5 and base electrode 9. Third resistor R3 is connected to negative terminal 7 and gate electrode 15.

The circuit also provides means 23 for connecting an electrical load between positive terminal 5 and drain electrode 17. Finally, means 25 for receiving an external switching device between base electrode 9 and negative terminal 7 is provided.

When the switching device is closed the voltage at capacitor C1 and base electrode 9 is zero. The voltage at both the emitter electrode 11 and the collector electrode 13 is approximately 0.7 volts. Since collector electrode 13 voltage is identical to the voltage at gate electrode 15 the voltage threshold of TTL device Q2 is not reached and therefore TTL device Q2 is off.

When the switching device is opened capacitor C1 begins to charge and the voltage at collector electrode 13 follows the voltage at emitter electrode 11. When the voltage at collector electrode 13 reaches TTL device Q2 threshold voltage, drain electrode 17 turns on and thus switches voltage to the load. When the voltage at capacitor C1 reaches the source voltage minus 0.7 volts, transistor Q1 enters its active region and the resistance between collector electrode 13 and emitter electrode 11 increases until the voltage at collector electrode 13 drops below the threshold voltage of TTL device Q2. Drain electrode 17 turns off thereby switching off source voltage to the load.

Selecting appropriate values for resistors Rl and R2 and capacitor C1 allows adjustment of the temporal length of the activation pulse. In this fashion activation pulse time can be varied to conform to the specifications of the load to be driven.

We claim:

1. A circuit for providing a single activation of an electrical load which comprises:

positive and negative terminals connected to a source of direct current potential;

a transistor having collector, emitter, and base electrodes;

a capacitor connected to the base electrode of said transistor and said negative terminal, the capacitance of said capacitor being selectively variable up to a predetermined maximum capacitance;

a FET device having gate, source, and drain electrodes, the gate electrode of said FET device connected to the collector electrode of said transistor, and the source electrode of said FET device connected to said negative terminal;

a first resistor connected to said positive terminal and the emitter electrode of said transistor, the resistance of said first resistor being selectively variable up to a first predetermined maximum resistance;

a second resistor connected to said positive terminal and the base of said transistor, the resistance of said second resistor being selectively variable up to a second predetermined maximum resistance;

a third resistor connected to said negative terminal and the gate electrode of said FET device;

an electrical load coupled between said positive terminal and the drain electrode of said FET device; and a switching device coupled between the base electrode of said transistor and said negative terminal.

* * * * *